(12) United States Patent
Sibbald et al.

(10) Patent No.: US 10,419,841 B2
(45) Date of Patent: Sep. 17, 2019

(54) ACOUSTIC COUPLING ARRANGEMENTS FOR NOISE-CANCELLING HEADPHONES AND EARPHONES

(71) Applicant: Incus Laboratories Limited, Buckinghamshire (GB)

(72) Inventors: Alastair Sibbald, Buckinghamshire (GB); Peter John McCutcheon, Buckinghamshire (GB); Robert Alcock, Buckinghamshire (GB)

(73) Assignee: INCUS LABORATORIES LIMITED, Buckinghamshire (GB)

( * ) Notice: Subject to any disclaimer, the term of this patent is extended or adjusted under 35 U.S.C. 154(b) by 0 days.

(21) Appl. No.: 15/454,543

(22) Filed: Mar. 9, 2017

(65) Prior Publication Data
US 2018/0041828 A1 Feb. 8, 2018

(30) Foreign Application Priority Data

Aug. 5, 2016 (GB) .................................. 1613508.9

(51) Int. Cl.
*H04R 1/10* (2006.01)
*H04R 5/033* (2006.01)
(Continued)

(52) U.S. Cl.
CPC ......... *H04R 1/1075* (2013.01); *B81B 7/0061* (2013.01); *G10K 11/178* (2013.01);
(Continued)

(58) Field of Classification Search
CPC .. H04R 1/1016; H04R 1/1083; H04R 1/1008; H04R 1/2849; H04R 1/2826;
(Continued)

(56) References Cited

U.S. PATENT DOCUMENTS

| 8,989,424 B2 | 3/2015 | Sibbald et al. |
| 10,009,694 B2 | 6/2018 | Sibbald et al. |
| 2004/0013273 A1 | 1/2004 | Vaishya et al. |
| 2010/0226505 A1 | 9/2010 | Kimura |

(Continued)

FOREIGN PATENT DOCUMENTS

| CN | 107690102 A | 2/2018 |
| CN | 107690116 A | 2/2018 |

(Continued)

OTHER PUBLICATIONS

Search Report dated Aug. 17, 2016 (1 page) out of Great Britain priority Application No. GB1613508.9.

(Continued)

*Primary Examiner* — Joshua Kaufman
(74) *Attorney, Agent, or Firm* — Patterson Thuente Pedersen, P.A.

(57) ABSTRACT

An active noise-reduction headphone arrangement has a housing bearing a loudspeaker having a first diaphragm surface coupled to a first volume of air bounded by and coupled to a user's ear, and a second diaphragm surface bounding a cavity within the housing assembly so as to define a second volume of air, rearward of the diaphragm; a conduit provided in the housing, the conduit being in fluid communication the ambient air via a first acoustic couple means having a first characteristic acoustic impedance, the conduit also being in fluid communication with said second volume of air via a second acoustic couple means having a second characteristic acoustic impedance; and a microphone having an inlet coupled acoustically to a predetermined location within the conduit.

10 Claims, 15 Drawing Sheets

(51) Int. Cl.
*G10K 11/178* (2006.01)
*H04R 19/00* (2006.01)
*H04R 31/00* (2006.01)
*B81B 7/00* (2006.01)
*H04R 19/04* (2006.01)
*H04R 1/28* (2006.01)
*H04M 1/03* (2006.01)

(52) U.S. Cl.
CPC ..... *G10K 11/17857* (2018.01); *H04R 1/1083* (2013.01); *H04R 1/2876* (2013.01); *H04R 5/033* (2013.01); *H04R 19/005* (2013.01); *H04R 19/04* (2013.01); *H04R 31/006* (2013.01); *B81B 2201/0257* (2013.01); *B81B 2207/012* (2013.01); *G10K 2210/1081* (2013.01); *G10K 2210/3011* (2013.01); *G10K 2210/3219* (2013.01); *G10K 2210/3226* (2013.01); *H04M 1/03* (2013.01); *H04R 2201/003* (2013.01); *H04R 2410/05* (2013.01); *H04R 2460/01* (2013.01)

(58) Field of Classification Search
CPC .. H04R 1/2846; H04R 1/1075; H04R 1/2823; H04R 2410/05; H04R 2460/11
See application file for complete search history.

(56) References Cited

U.S. PATENT DOCUMENTS

2014/0294182 A1    10/2014  Axelsson et al.
2015/0010191 A1     1/2015  Baumhauer, Jr. et al.
2015/0382100 A1*   12/2015  Azmi ................... H04R 1/1091
                                                                381/380

FOREIGN PATENT DOCUMENTS

| EP | 3279892 A1 | 2/2018 |
| EP | 3282443 A1 | 2/2018 |
| GB | 2445388 A | 7/2008 |
| GB | 2475526 A | 5/2011 |
| GB | 2526945 | 12/2015 |
| GB | 2526945 A | 12/2015 |
| JP | 2009278167 | 11/2009 |
| JP | 2009278167 A | 11/2009 |

OTHER PUBLICATIONS

Examination Report and Notification of Intention to Grant under Section 18(4) dated Mar. 7, 2017 (2 pages) out of Great Britain priority Application No. GB1613508.9.
Search Report dated Aug. 18, 2016 for GB Application No. 1613508.9, 5 pages.

* cited by examiner

ACOUSTIC COUPLING ARRANGEMENTS FOR NOISE-CANCELLING HEADPHONES AND EARPHONES

This application claims priority to British Patent Application No. 1613508.9 filed Aug. 5, 2016, the entire contents of which is incorporated herein by reference.

BACKGROUND

The present invention relates generally to headphones and earphones featuring ambient noise cancellation ("ANC")—sometimes termed ambient noise reduction ("ANR")—commonly used at present in conjunction with mobile electronic devices such as cellular telephone handsets and music players. In particular, the invention relates to physical arrangements that are integrated into the headphones and earphones and which allow the noise-cancellation processing to be calibrated without the use of external measurement systems, in order to allow very rapid manufacture with minimal manual involvement on the production-line. The present invention is particularly suitable for feedforward-type ANC headphones and earphones.

For simplicity of explanation, the invention will be described in respect of an ANC headphone. It will be appreciated that the invention is equally applicable to an earphone, including those in headsets for communication.

SUMMARY

For clarity of description, it is useful to show firstly the structure of a typical ANC headphone. FIG. 1 shows a simplified section diagram of an ANC headphone 10 and its major constituent components.

The headphones use a small loudspeaker 12, typically a 40 mm diameter type, mounted on to a base-plate 14. The base-plate 14 is configured such that a circular or elliptical ear-cushion 16 can be mounted at the perimeter of its frontal surface, with a decorative mesh 18 fitted across the front of the speaker 12 to protect and mask it from view. The decorative mesh 18 has no acoustic function. The ear-cushion 16 is required to be substantially acoustically opaque, and so the skin material is generally made from leatherette to form a comfortable, doughnut-like acoustic seal around the ear and against the head, and the cushion is usually filled with foam rubber, and preferably a viscoelastic foam ("memory foam"). The volume of air bounded by the inner surface of the ear-cushion lying between the ear and the base-plate is termed the "front volume", indicated in FIG. 1 at 20.

The rearward surface of the base-plate must feature some cover or protection for the rear of the loudspeaker 12, and this can be either (a) a relatively "open" type of plastic grid arrangement that is largely acoustically transparent, or (b) a "closed" type of shell that is acoustically opaque. These are often referred to as "open" and "closed" type headphone structures, respectively. An open structure does not restrict the compliance of the loudspeaker in any way, and so its low-frequency performance is not restricted. Also, it does not add any significant resonant properties to the headphone, and so the open arrangement is preferred for hi-fi headphones with optimized frequency responses.

One minor disadvantage of the open headphone system is the small outward emission of sound from the rear of the speaker. However, a more important disadvantage is that the structure is relatively transparent, in acoustic terms, and so ambient noise travels through the open structure and then through the speaker itself to the ear of the listener without much attenuation.

A closed type of headphone structure, such as a rear shell 22 as shown in FIG. 1, reduces both the outward emission of sound, and also the inward-bound ambient noise. However, if a fully closed rear shell 22 were to be used, then the loudspeaker diaphragm—being coupled directly to the volume of air enclosed within the shell—must now drive against the air compliance as well as its own compliance, and this reduces the effective compliance of the loudspeaker. Consequently, the low-frequency performance of the speaker is reduced and the associated phase response is also affected, both of which conspire to make an ANC system more difficult to implement. The volume of air enclosed within the closed shell 22 behind the base-plate is termed the "rear volume", indicated in FIG. 1 at 24. A microphone 30 is mounted on the rear shell 22 which provides a signal indicative of ambient noise to be reduced to the ANC system.

In order to overcome this limitation and "free up" the loudspeaker 12 diaphragm motion, it is common practice to allow some air movement in and out of the rear volume 24 so that the speaker 12 diaphragm does not have to work against the additional compliance: in acoustic terms, this is adding a parallel inertance to the rear-volume compliance. This can be achieved by creating a vent in the rear shell, rear-vent 26 in FIG. 1, which, to reduce resonance in the rear volume 24, incorporates an acoustically resistive material 28 to limit the rate of airflow through the vent 26. The rear-vent 26 and its associated resistor 28 are both shown in FIG. 1. The combination of the resistive rear-vent 28 and the rear-volume 24 compliance acts as a high-cut acoustic filter on the inbound ambient noise, and this defines the passive attenuation property of the headphones at mid- and high-frequencies. Typically, the high-frequency sound attenuation between the external ambient and the ear becomes significant above 800 Hz or thereabouts.

An alternative air-flow pathway is from the rear-volume 24 to the front-volume 20 via the base-plate 14, again via an acoustic resistor, and this option is also shown in FIG. 1 (the "front-rear" acoustic resistor 32). The disadvantage of this approach is that it reduces the low-frequency response of the headphone 10 because, at low-frequencies, the sound pressure levels in the front-volume 20 are reduced owing to airflow into—and from—the rear-volume 24 (where the loudspeaker-generated pressure has the opposite polarity to that of the front-volume) via the front-rear acoustic resistor 32 and associated vent.

There are, however, good reasons to incorporate a front-rear acoustic couple such as front-rear acoustic resistor 32. When the headphones 10 are placed on the head, or removed from it, the ear-cushions 16—and hence the front-volume 20 of air in contact with the ear canal—undergo compression or de-compression. These compressions and de-compressions of air, being coupled directly to the ear-canal and the tympanic membrane, can be uncomfortable and unpleasant. In addition, these changes in pressure cause the loudspeaker 12 diaphragm to by pushed inwards and pulled outwards, respectively, beyond the range of its operating displacement, and this can cause permanent damage. Consequently, it is useful to have a small front-rear air-flow pathway to allow sufficient air-flow to reduce discomfort, but not enough such that it would impair the low-frequency performance of the headphones 10. This small pathway, on its own, is generally insufficient to alleviate the above problem of compliance-limiting caused by a fixed rear-volume 24, and so it is advantageous to use both a rear-vent 26 and a front-rear path, each with suitably chosen acoustic resistors in place to reduce resonance.

To achieve satisfactory noise cancellation, calibration of the headphones is required to account for unit-to-unit performance characteristics differences between headphones.

UK patent publication GB 2,475,526A describes a feedforward-type ANC calibration system, together with a novel means of manufacturing and calibrating modules for earphone manufacture. GB 2,475,526A describes the concept of a "Sensitivity Index" (SI) to adjust the magnitude of the noise-cancellation signal to its optimal level. The Sensitivity Index for a particular ANC headphone or earphone is defined to be the product of the sensitivities of its speaker and its external microphone. For the module system of GB 2,475,526A, this is obtained by inserting and clamping the ANC module into a special calibration system, driving a known electrical signal into the speaker, and measuring the magnitude of the resultant microphone signal. This process requires manual interaction, special equipment and then electronic storage of the resultant SI value for subsequent use by a suitable ANC processing scheme.

The basic concept of calibrating an acoustic noise-cancelling system by driving a reference signal into its speaker and measuring the received signal from its microphone is not new; there are numerous examples in the prior-art. For example, US patent publication US2004/0013273A1 describes the calibration of an active noise control system in which a calibration reference sound, driven through the noise-cancelling loudspeaker and received by the associated microphone, is used "to accommodate for any microphone drift or other irregularities that occur . . . ", and which "eliminates the need for an expensive calibrated microphone." However, this method is not practical for feedforward ANC headphones and earphones because of the high degree of natural acoustic isolation which exists between the ANC microphones and the respective speakers.

In order to facilitate the self-calibration of feedforward ANC headphones and earphones, the present invention provides a stable, pre-determined and precisely controlled acoustic couple between speaker and the external microphone, thereby enabling rapid ANC calibration without the need for time-consuming and costly external calibration procedures and hardware.

In accordance with a first aspect of the invention, there is provided an acoustic coupling arrangement, comprising:
a conduit provided in a body;
a first port in the body acoustically connecting the conduit to the ambient air;
a second port in the body for acoustically connecting the conduit to a rear volume of a headphone loudspeaker in use, the second port being spaced apart from the first port;
a microphone having an inlet coupled acoustically to a predetermined location within the conduit, said inlet being spaced apart from the first port.

Preferably, the conduit contains a first acoustically resistive material.

Preferably, the first port comprises a first open end of the conduit.

Preferably, the second port comprises a second open end of the conduit remote from the first end.

Preferably, the second port is provided in a wall of the conduit.

Preferably, the second port is covered, or at least partially filled, with a second acoustically resistive material.

Preferably, the second port is provided proximate to the microphone.

Preferably, the arrangement further comprises a third acoustically resistive material covering the first port.

Preferably, a cover is provided over the first end of the conduit, the first port comprising a plurality of first openings provided in the cover.

Preferably, a third acoustically resistive material covering the first openings.

Preferably, the second port comprises a plurality of second openings.

Preferably, the second openings are distributed over an area and are arranged around the microphone.

In accordance with a second aspect of this invention, there is provided an active noise-reduction headphone arrangement comprising:
a housing bearing a loudspeaker having a first diaphragm surface coupled to a first volume of air bounded by and coupled to a user's ear, and a second diaphragm surface bounding a cavity within the housing assembly so as to define a second volume of air, rearward of the diaphragm;
a conduit provided in the housing, the conduit being in fluid communication with the ambient air external to the housing via a first acoustic couple means having a first characteristic acoustic impedance, the conduit also being in fluid communication with said second volume of air via a second acoustic couple means having a second characteristic acoustic impedance; and
a microphone having an inlet coupled acoustically to a predetermined location within the conduit.

Preferably, at least one of the first and second acoustic couple means have acoustic impedance properties primarily characteristic of an acoustic resistance.

Preferably, at least one of the first and second acoustic couple means are formed by sealing an overlying layer of resistive mesh material on to an opening having a predetermined surface area.

Preferably, at least one of the first and second acoustic couple means are formed by incorporating a material having a bulk acoustic resistance property into the conduit.

Preferably, at least one of the first and second acoustic couple means have acoustic impedance properties primarily characteristic of an acoustic inertance.

Preferably, at least one of the first and second acoustic couple means are formed by a tube, recess, or conduit or by radiation impedance coupled to said microphone.

Preferably, at least one of the first and second acoustic couple means comprises a plurality of openings arranged substantially symmetrically around a primary axis of the microphone.

Preferably, the arrangement operates simultaneously and in conjunction with a feedback-type ambient noise-reduction system.

Preferably, the arrangement operates simultaneously and in conjunction with both a feed-forward ANC system and a feedback ANC system.

BRIEF DESCRIPTION OF THE DRAWINGS

The invention will now be described with reference to the accompanying drawings, in which.

DETAILED DESCRIPTION

Figure 1:
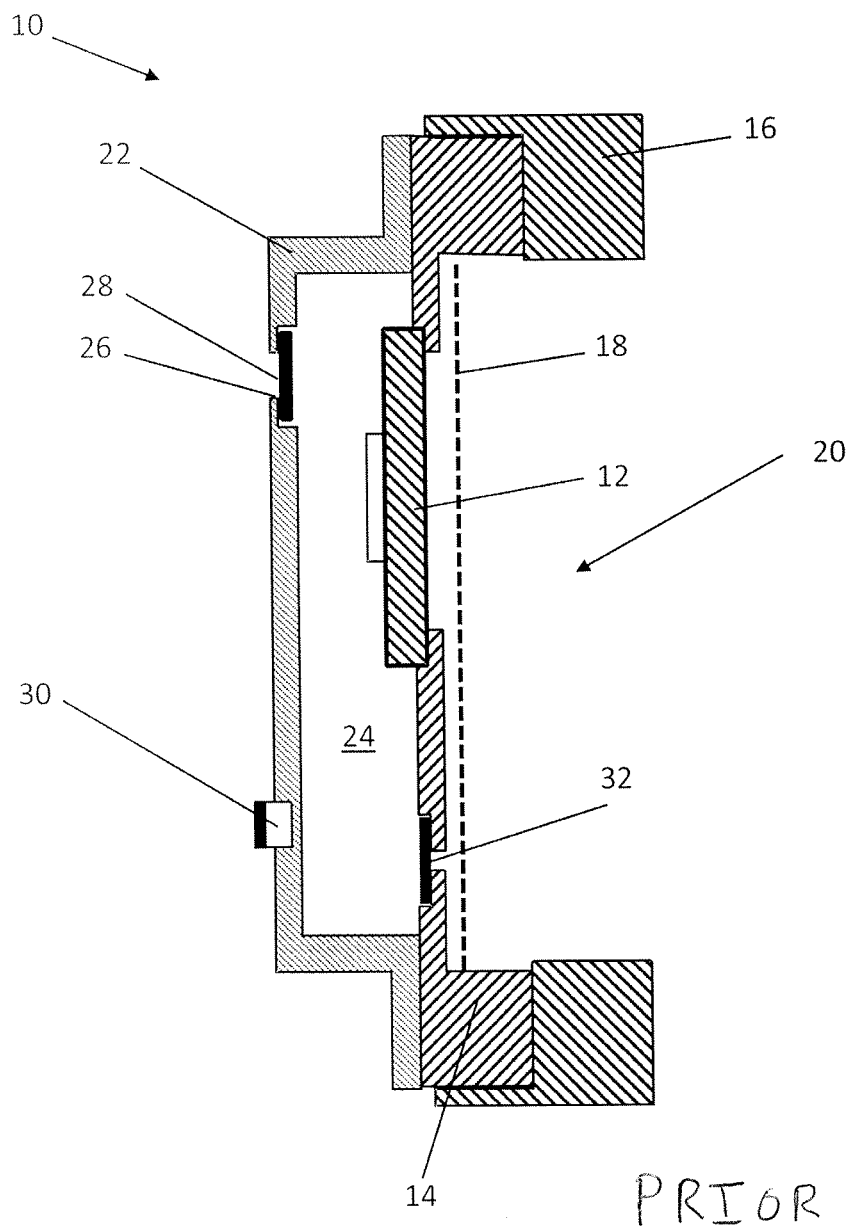
FIG. 1 is a cross-section of a prior art headphone.

The present invention is an acoustic coupling arrangement which is useful to calibrate feedforward-type ANC headphones and earphones using their own internal transducers instead of an external calibration system. Specifically, the invention is an arrangement for acoustically coupling a signal from the speaker to the external microphone such that a signal related to the Sensitivity Index (of the speaker and microphone) may be generated which can be used subsequently to set the magnitude of the ANC signal generated by an ANC processor.

The concept of deliberately coupling a signal from the speaker to the external ANC microphone is totally contrary to the accepted wisdom of ANC headphone and earphone design as described on page 15 in GB 2,445,388: "It is desirable, in such an embodiment, that the ambient noise-sensing microphones are positioned as far as possible from the outlet port pairs." The reasons for this are that if any part of the ANC speaker signal, which is derived from the external microphone, were to be coupled back to the same external microphone, it would create a time-delayed feedback loop with the following potential consequences.

The possibility of unstable positive feedback in the ANC system, causing "howl around" and loud whistling at the user's ear.

The likelihood that the feedforward noise-cancellation effectiveness would be significantly impaired by such an acoustic couple, because the noise-cancellation is dependent on very accurately defined electronic filtering, free from time-delay effects.

The possibility that the quality of music playback and other audio will be also degraded by comb-filtering introduced by the acoustic couple.

In the present invention, the speaker signal that is chosen to drive the acoustic couple can be extracted from either the front-volume or rear-volume of the headphone structure. Although such signals are mutually of opposite phase, the signal required to couple to the microphone from the speaker is relatively small and can be compensated for.

If a front-volume signal is used, then this is in opposite phase with respect to the incoming noise, and so positive-feedback problems are less than with a signal derived from the rear-volume, although the function is affected by whether an ear is present in the headphone front cavity. For calibration in a factory under controlled conditions, this is not relevant, of course. However, it is much more practical and convenient to use the rear-volume signal because the rear vent of the headphone can easily be situated closely to the external microphone inlet port, and this allows several elegant coupling mechanisms to be created.

The invention uses the novel concept of an "acoustic potentiometer" to control accurately the magnitude of the signal that is coupled from the speaker to the feedforward ANC microphone. Three different methods are disclosed for creating the acoustic potentiometer arrangement, using different types of acoustic resistor material. The first method uses material having a bulk acoustic resistivity, such as an open-cell expanded foam rubber, and preferably a viscoelastic foam ("memory foam") because it is stable and partially damped, which reduces microphony effects. The second method uses a sheet-type material that is well-known for use as acoustic resistor material, such as nylon mesh or similar material. The third method for creating an acoustic potentiometer uses a combination of an acoustic resistor and an acoustic inertance, and this is a very practical way to implement the invention, particularly for in-ear earphones, where the available space is somewhat restricted.

Figure 2A:
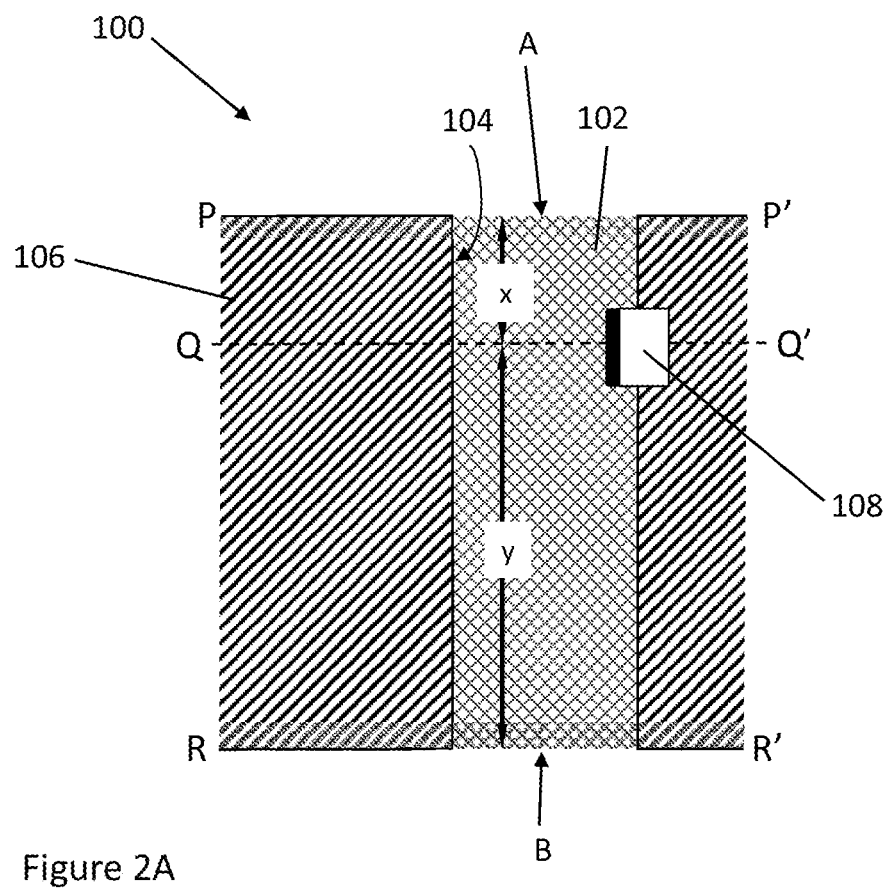
FIG. 2A illustrates an acoustic coupling arrangement incorporating a first type of acoustic potentiometer, according to the invention.

FIG. 2A depicts an acoustic coupling arrangement 100 based on the principle of the first type of acoustic potentiometer arrangement ("Type 1"). A material 102 having a suitable bulk acoustic resistivity, such as viscoelastic foam, is used, in which a cylinder or column of the bulk resistive material 102 is arranged so as to form an acoustic couple between two separated acoustic environments, coupled to the bulk resistive material 102 at port "A" (uppermost) and port "B" (lowermost). This might represent, for example, a conduit 104 created through the outer shell 106 of a headphone, and filled with a short cylinder of viscoelastic foam, where the lower port "B" couples to a rear volume of the headphone at plane R-R', and the uppermost port "A" couples to the ambient air at plane P-P'. A microphone 108 is disposed at an intermediate plane Q-Q' which is located a distance x from P-P' and a distance y from R-R'. Accordingly, the sound pressure in the bulk material at the plane Q-Q' of the microphone 108 is proportional to the difference in sound pressures between ports "A" and "B" and is dependent on the ratio of distances x and y, in a manner analogous to the "slider" on an electrical potentiometer, as will be appreciated by those skilled in the art. The sound pressure varies in a linear manner along the length of the material 102, and so if the sound pressure level (SPL) at ports A and B are $SPL_A$ and $SPL_B$ respectively, and the SPL at the microphone is $SPL_Q$, then the sound pressure at the microphone 108 can be calculated as follows.

$$SPL_Q = \left\{\frac{y}{y+x}\right\}(SPL_A - SPL_B) + SPL_B \qquad [1]$$

Figure 2B:
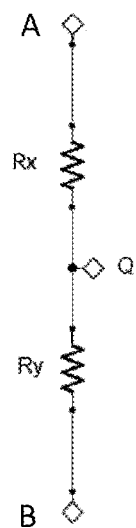
FIG. 2B shows an equivalent electrical circuit for the acoustic coupling arrangement in FIG. 2A.

Accordingly, this Type 1 arrangement provides a controlled and accurate method of transferring a pre-determined fraction of an acoustic signal to a chosen microphone 108. For practical purposes the acoustic inertance and compliance of the material 102 itself can be ignored because these acoustic effects are relatively small compared to the acoustic resistance of the material. FIG. 2B shows the equivalent analogous electrical network where acoustic resistances are depicted as Rx and Ry, the microphone as Q, and the ports as A and B.

Figure 3A:
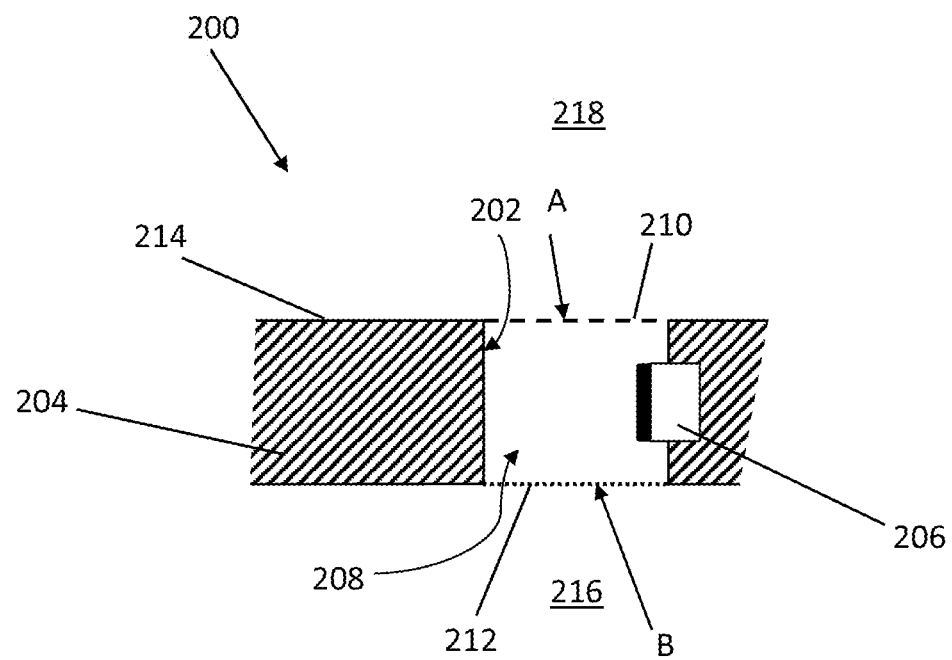
FIG. 3A illustrates an acoustic coupling arrangement incorporating a second type of acoustic potentiometer, according to the invention.

FIG. 3A depicts an acoustic coupling arrangement 200 based on the principle of the second type of acoustic potentiometer arrangement ("Type 2"), which uses a thin sheet material having a suitable acoustic resistivity through the plane of the material itself, such as nylon mesh, perforated foil and the like. These materials are all widely used in headphone and loudspeaker manufacture, and can be obtained with a wide range of acoustic resistances, dependent, for example, on the closeness of the woven mesh, perforations or other acoustic pathways through the material from one surface to the other. FIG. 3A shows a conduit 202 formed through a solid material 204 featuring, once again, an uppermost port "A" and a lowermost port "B", and with a microphone 206 situated within the cavity 208 formed in the conduit 202. In this case, there is no merit in having an extended length to the system. Each of the two ports A, B is overlain by an acoustic resistor 210, 212, respectively, formed from the resistive sheet material, such that each port has a well-defined acoustic resistance (in MKS units of acoustic ohms). These acoustic resistances are defined by both (a) the area of exposed resistor material, and (b) the specific acoustic conductance of the chosen material. Accordingly, a wide range of acoustic resistor values can be engineered with accuracy. The overall, serial acoustic resistance of the potentiometer arrangement is the sum of the two port resistances.

This arrangement 200 is similar to the arrangement 100 in that it represents a pair of serially connected resistors, with the interconnecting node coupled to the microphone 206, so as to form an "acoustic potentiometer". Here, the uppermost acoustic resistor 210 at port "A" of FIG. 3A corresponds to the acoustic resistor Rx of FIG. 2B, and the lowermost acoustic resistor 212 at port "B" of FIG. 3A corresponds to the acoustic resistor Ry of FIG. 2B. Consequently, equation [1] also applies to this configuration, too.

FIG. 3A shows the acoustic potentiometer arrangement 200 configured in the rear shell 214 of a headphone, between the rear volume 216 and the ambient 218. In a practical headphone the rear vent might be required to have an acoustic resistance of, say, 50 ohms in order to provide a suitable acoustic frequency response. In this instance, if it were required to drive the ANC microphone with a small proportion, say 10%, of the rear volume acoustic pressure signal, then the respective resistances of the two ports could be chosen to: (a) provide a 10% signal to the microphone, and (b) have a combined sum of 50 ohms. Consequently, the acoustic resistor 210 would be required to have a resistance of 5 acoustic ohms, and acoustic resistor 212 to have a resistance of 45 acoustic ohms.

Figure 3B:
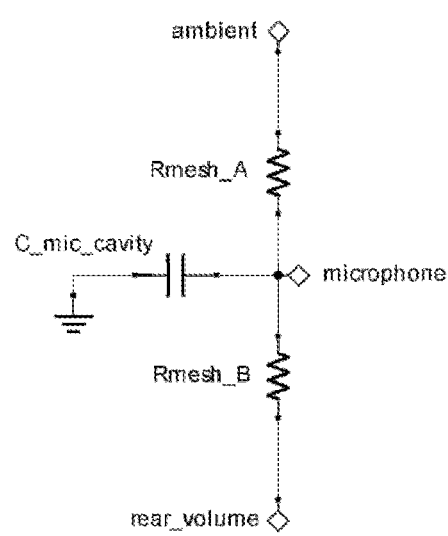
FIG. 3B shows an equivalent electrical circuit for the acoustic coupling arrangement in FIG. 3A.

FIG. 3B shows the acoustic arrangement of FIG. 3A as an equivalent analogous electrical circuit, in which acoustic resistors 210, 212 are represented by the resistors "Rmesh_A" and "Rmesh_B" respectively. In the acoustic arrangement there is necessarily a small central cavity 208 in which the microphone 206 is located, and this volume of air—an acoustic compliance—is represented in FIG. 3B in the electrical equivalent circuit by the ground-connected capacitance "C_mic_cavity". In practice, the effect of this compliance is likely to be relatively small compared to that of the resistors, but it is included here for completeness.

An additional benefit conferred by the acoustic coupling arrangements shown in FIGS. 2A and 3A is that the feed-forward microphone is not exposed directly to the ambient; rather it is shielded to some extent by either viscoelastic foam or mesh, which reduces wind-noise related artifacts. Another useful feature is that both of the structures are intrinsically damped due to their resistive elements and so do not add any resonant structures to the headphones or earphones which would significantly complicate and impair the associated ANC processing.

Figure 4A:
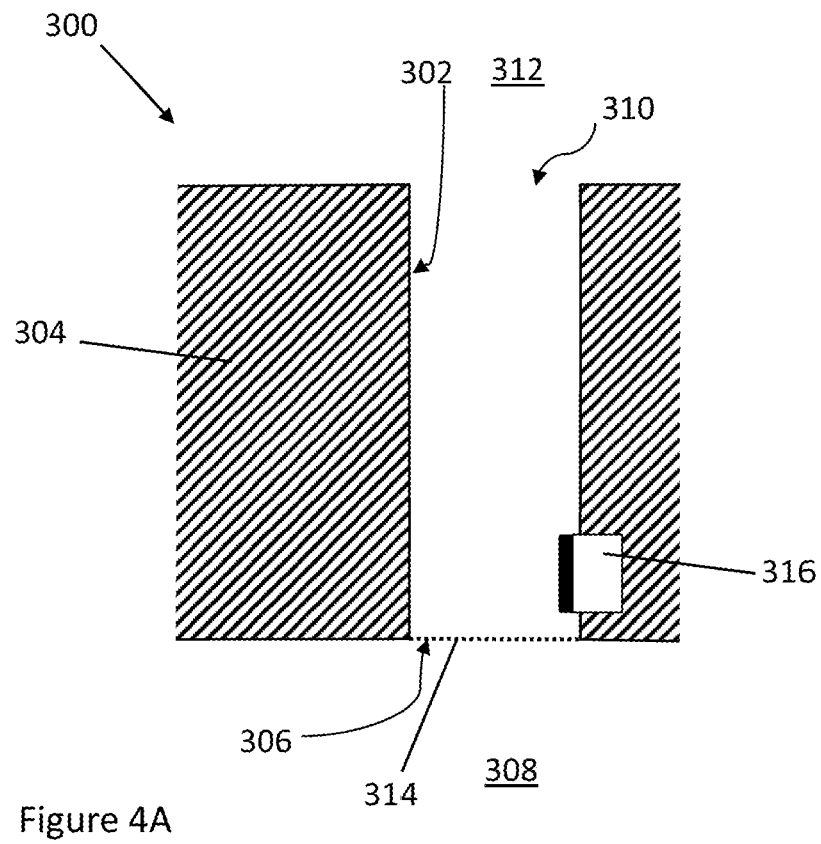
FIG. 4A illustrates an acoustic coupling arrangement incorporating a third type of acoustic potentiometer, according to the invention.

FIG. 4A depicts an acoustic coupling arrangement 300 incorporating a third type of acoustic potentiometer ("Type 3"). This time, instead of being based on a pair of acoustic resistors, it is based on the use of an acoustic resistor and an acoustic inertance, the latter representing a tube or conduit or the like, and conveniently formed as part of a plastic moulding of an earphone or headphone.

Referring to FIG. 4A, an elongate conduit 302 is formed through the shell or casing 304 of an earphone or headphone, with its lowermost opening, or port 306, coupled to a rear volume 308 of the headphone, and the uppermost port 310 exposed to the ambient air 312. An acoustic resistor 314, in the form of a resistive mesh, is present across the port 306, providing resistance to airflow between air in the conduit 302 and air in the rear volume of the headphones. A microphone 316 is located in the conduit 302 spaced apart from the port 310. As shown in FIG. 4, in this embodiment the microphone 316 is provided near the port 306 and acoustic resistor 314. Air in the conduit 302 has the property of an acoustic mass, or inertance, which is analogous to an electrical inductance—and thus has an acoustic impedance that increases with frequency.

Acoustic mass $M_A$ is analogous to (Mechanical) Mass $M_M$, but has the dimensions kg·m$^{-4}$. It is associated with a mass of gas which undergoes acceleration by a net force without compression. The acoustic mass (or inertance), $M_A$, of air in the conduit 302, can be calculated from the mechanical mass, $M_M$, of the air present in the conduit, and its cross sectional area, S, as follows.

$$M_A = \frac{M_M}{S^2} \text{kg} \cdot m^{-4} \qquad [2]$$

The mass of air, $M_M$, can be calculated from the volume of air in the conduit 302 and the density of air, $\rho_0$ (about 1.18 kg·m$^{-3}$ at standard temperature and pressure). Further calculation for a tube of air, having length L and cross-sectional area S, reveals the acoustic mass $M_{tube}$ to be the following.

$$M_{tube} = \rho_0 \frac{L}{S} \text{kg} \cdot m^{-4} \qquad [3]$$

The corresponding acoustic impedance, $Z_A$, at frequency f, is analogous to that of an inductance, as follows.

$$Z_A = 2\pi f M_A \text{ acoustic ohms}(MKS) \qquad [4]$$

The conduit dimensions can be relatively small and yet still be very effective for use in the invention. For example, a conduit that is 0.6 mm diameter and 4 mm in length has an inertance corresponding to an electrical equivalent of 167 mH, and an acoustic impedance of 188 ohms at 1 kHz; it also has a serial resistive component of 283 ohms. Similarly, a 1 mm diameter acoustic resistor formed of 420 Grade nylon mesh—suitable for an in-ear earphone—has a typical acoustic resistance of about 2500 ohms. These impedance values for conduit and mesh are similar in scale and therefore they are well-suited for making a nicely-balanced acoustic potentiometer operating at 1 kHz and thereabouts.

Figure 4B:
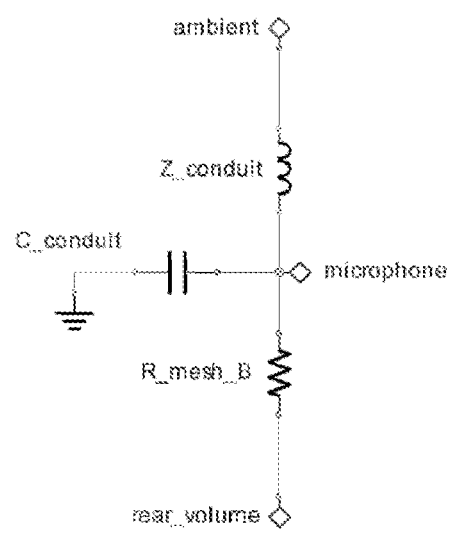
FIG. 4B shows an equivalent electrical circuit for the acoustic coupling arrangement in FIG. 4A.

FIG. 4B shows the equivalent analogous electrical circuit that represents the simple acoustic arrangement (network) of FIG. 4A, in which the acoustic impedance of the conduit 302 is "Z_conduit", the impedance (resistance) of the acoustic resistor 314 is "R_mesh_B", and the compliance of the conduit 302 is "C_conduit". Further development of this simple model would add a radiation impedance to the ambient node, but this simple model suffices to explain the principle of the arrangement as an acoustic potentiometer. Although the conduit inertance introduces a frequency-dependent element into the acoustic couple, it is stable and can be engineered with precision and reproducibility with suitable impedance properties for the present invention by, for example, precision plastic moulding.

Figure 5:
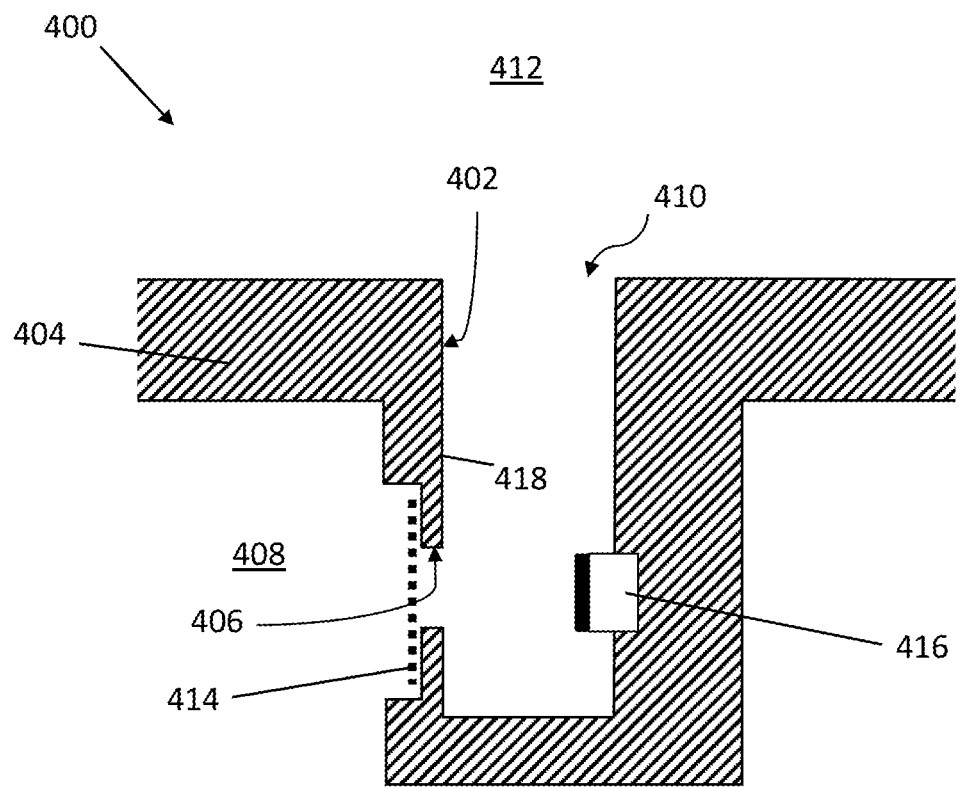
FIG. 5 shows an acoustic coupling arrangement according to a first embodiment of the invention.

FIG. 5 shows a practical embodiment of an acoustic coupling arrangement 400 incorporating a Type 3 acoustic potentiometer. Like reference numerals are used to denote like parts to those in FIG. 4A, with 100 added thereto. In the embodiment shown in FIG. 5, the port 406 is located in a sidewall 418 of the conduit 402 facing the microphone 416. This configuration is well-suited for application in small earphones, as will be described later. The analogous electrical circuit of this arrangement is, again, that of FIG. 4B.

Figure 6:
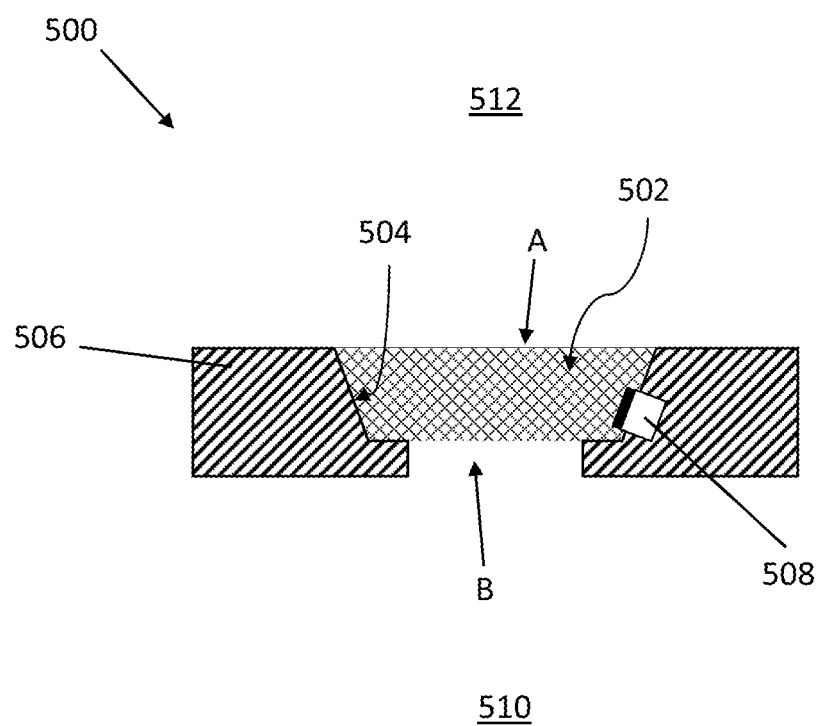
FIG. 6 shows an acoustic coupling arrangement according to a second embodiment of the invention.

FIG. 6 shows a practical embodiment of an acoustic coupling arrangement 500 incorporating a Type 1 acoustic potentiometer using bulk acoustic resistor material, suitable for application to both headphones and earphones. Like reference numerals are used to denote like parts to those in FIG. 2A, with 400 added thereto. In the embodiment shown in FIG. 5, Here, the conduit 504 of the headphone/earphone contains an acoustic resistor 502 in the form of a plug of viscoelastic foam rubber or other material having suitable a bulk acoustic resistivity. The microphone 508 is disposed so as to sample sound pressure at an intermediate plane between the rear volume 510 and external ambient 512, following the principles of FIGS. 2A and 2B, and Equation [1].

Figure 7:
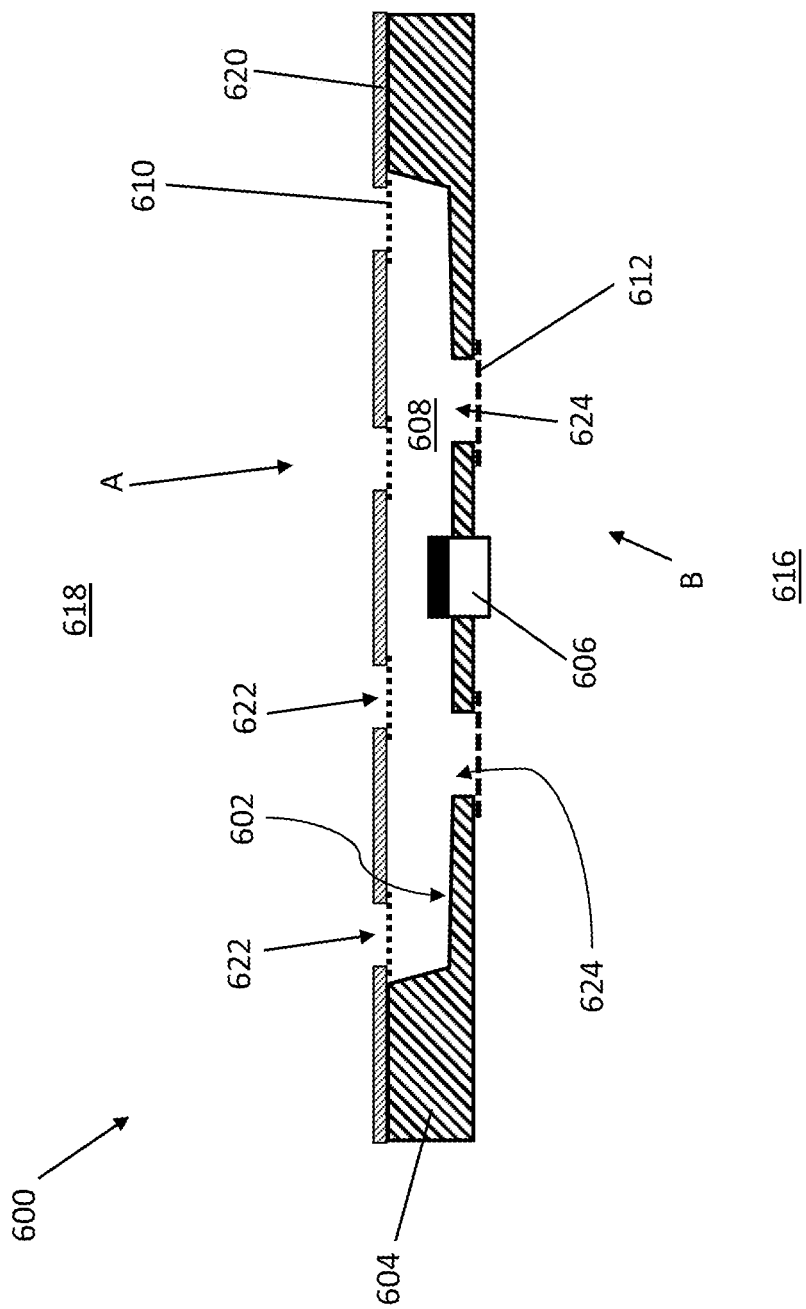
FIG. 7 shows an acoustic coupling arrangement according to a third embodiment of the invention.

FIG. 7 shows a practical embodiment of an acoustic coupling arrangement 600 incorporating a Type 2 acoustic potentiometer, using sheet acoustic resistor material that is suitable for application to both headphones and earphones. Like reference numerals are used to denote like parts to those in FIG. 3A, with 400 added thereto.

The acoustic coupling arrangement 600 is a more sophisticated arrangement, based on the structures of FIG. 3A, with addition features in the design, as follows.

As described above, in conventional rear-vented headphones the rear vent is the entry point for airborne ambient noise to enter the headphone structure and travel to the ear. Ideally, therefore, the microphone should be positioned at this same point in order to create a noise-cancelling waveform with the same amplitude and phase properties as the incoming noise. If the microphone were positioned several centimeters from the rear vent, then there could be time—and therefore phase—discrepancies between the two. A 20 mm distance represents an acoustic path with a time period of 58 µs and corresponding phase value of 21° at 1 kHz, and this would significantly impair ANC performance, as described in GB 2,475,526A. In practice, incoming noise can arrive from any direction, sometimes arriving at the vent 20 mm ahead of the microphone, and sometimes vice-versa. Consequently, there could be a ±21° phase variation (at 1 kHz) between the microphone signal and the incoming noise signal, and this variation—and the resultant ANC performance—would be direction dependent, and audible to a listener. However, as noted earlier, in a conventional, prior-art ANC headphone or earphone, if the external microphone is positioned too closely to the rear-vent, the system would become susceptible to "howl-around" positive feedback and similar instabilities.

The acoustic coupling arrangement 600 includes a cover 620 over the port 'A'. A plurality of openings 622 are provided in the cover 620 to form the port A. The openings are spatially distributed over a predetermined area that is preferably centered over the microphone 606. For example, the openings 622 could be arranged in a "pepper-pot" pattern across a 20 mm diameter area. While a cover 620 is shown in FIG. 7, in other embodiments, the cover may be integral with the outer shell of the headphone.

Similarly, the port B is comprised of a plurality of second openings 624 spatially distributed over a second predetermined area that is preferably centered around the microphone 606.

If there is a single outer vent, it can become occluded if, for example, the user's head rests against a pillow, and consequently the ANC would be impaired and there might be the possibility of instability or feedback. By using a multiplicity of outer vents, spatially distributed over a predetermined area, this situation can be avoided (as it is unlikely that all of the vents could be blocked).

The embodiment of FIG. 7 features the microphone 606 arranged generally centrally with respect to the second openings 624 of part B and the openings 622 of port A. The openings 622, 624 may be configured in a one-dimensional linear array or a two-dimensional area array (such as the "pepper-pot" pattern).

The acoustic coupling arrangement 600 allows precisely controlled attenuation of the magnitude of the acoustic couple between the rear volume 616 and ambient 618. The location of the microphone 606 relative to the openings 622, 624 results in the microphone 606 detecting incoming noise at its precise airborne point-of-entry into the earphone or headphone. The result is that the microphone/vent arrangement is phase-coherent to incoming noise from all directions in three dimensions, and therefore it confers a valuable omni-directional property on the resultant noise cancellation performance—the noise-cancellation performance is not direction-dependent, as it is with current ANC headphones, where the residual noise can be heard to change character and volume when the user's head is rotated with respect to the noise source.

Figure 8:
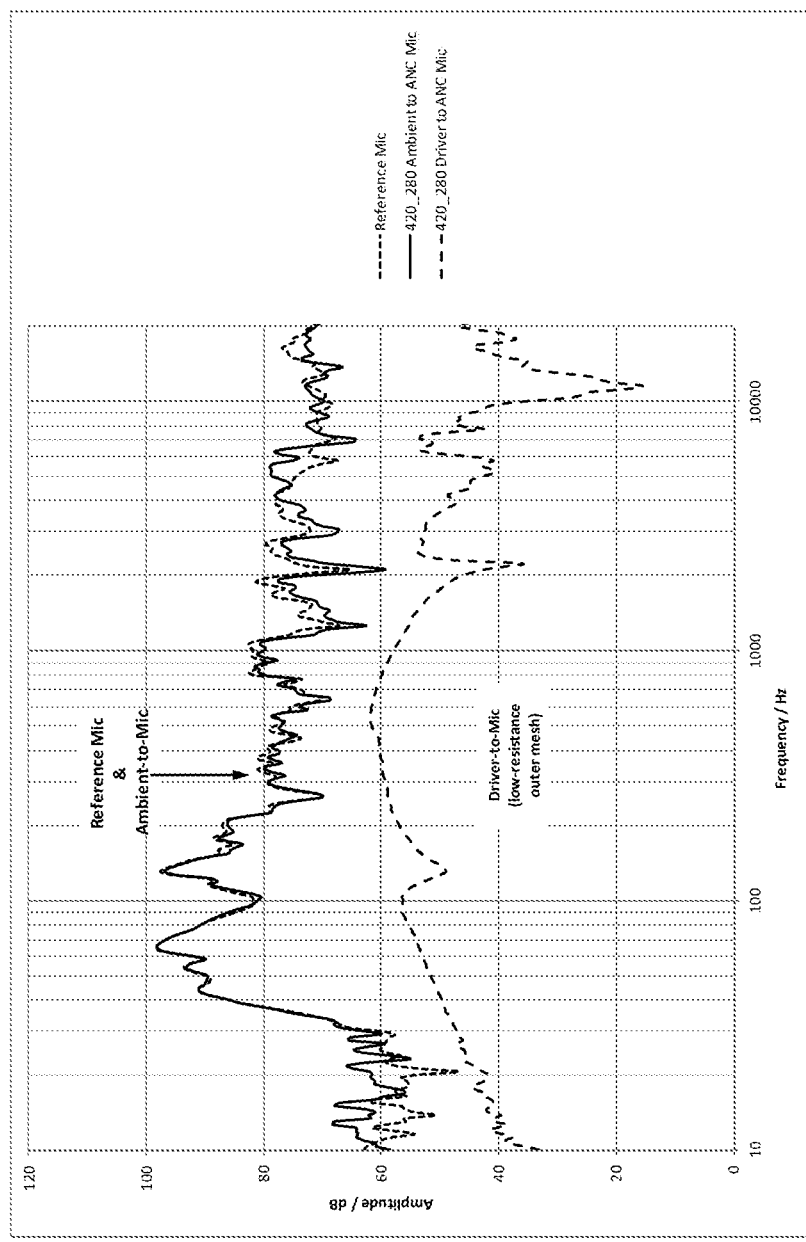
FIGS. 8 and 9 are graphs showing performance measurements of the embodiment of FIG. 5.
Figure 9:
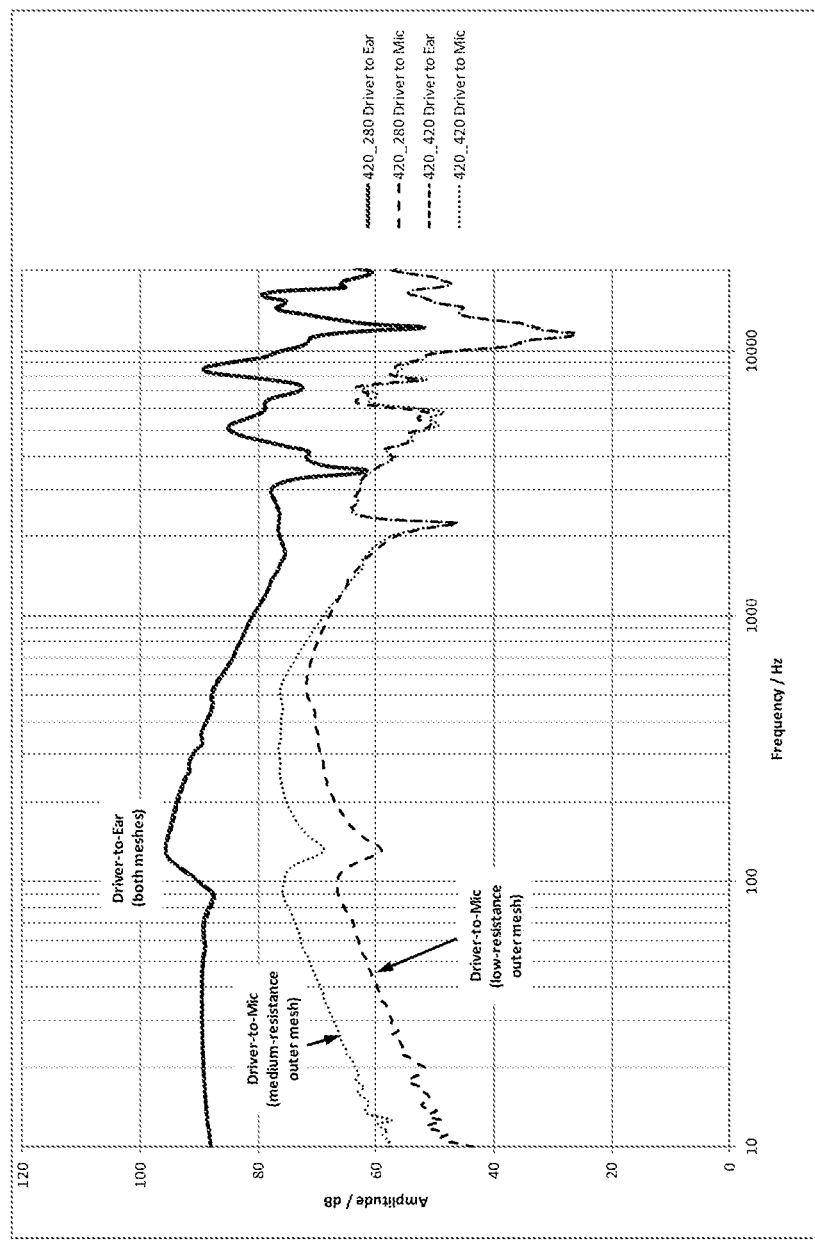

FIGS. 8 and 9 show frequency response and amplitude data from a circumaural ANC headphone into which the invention has been integrated using the embodiment as shown in FIG. 3A. The headphones used a 40 mm speaker, and a 4 mm electret feedforward ANC microphone. Nylon mesh was used for the acoustic resistors 210, 212 in the ports A, B respectively; two mesh types were used having different specific acoustic resistances (Type 280 and Type 420; the latter being denser and having a greater acoustic resistance). In both instances, the medium-density mesh (Type 420) was used on the 7 mm diameter port B, providing an acoustic resistance of about 20 acoustic ohms.

Firstly, FIG. 8 shows various transfer functions using the lower-resistance, Type 280 mesh on the outermost rear vent, in order to provide a relatively small acoustic couple from speaker to mic, thereby minimally disturbing the Driver-to-Ear and Ambient-to-Mic functions. The uppermost two traces (lying on top of one another), show plots from: (1) a reference microphone directly adjacent to the headphone shell; and (2) the feedforward microphone in this embodiment of the invention. As is clear, there is little discernible difference between the two, which shows that the microphone response of the invention to external stimuli is virtually unaffected by its couple to the rear volume. (Both plots here incorporate the response of the measurement loudspeaker, which has not been compensated out.)

Next, the lowermost plot of FIG. 8 shows the Speaker-to-Microphone response. This is the couple from the rear volume 216 to the feedforward ANC microphone 206, and this is the signal used for self-calibration.

FIG. 9 shows various transfer functions for differing densities of outer mesh 210, demonstrating that the calibration signal level at the microphone 206 can be controlled with precision.

The uppermost two traces of FIG. 9 (lying virtually one on top of the other), show headphone Driver-to-Ear plots from an artificial head ear-simulator on which the headphones were mounted, in order to show that the different mesh resistances did not disturb the normal frequency-response of the headphones. As is clear, there is little or no discernible difference between the two, and so the use of the invention does not affect the natural acoustic response of the headphones significantly.

Next, the lowermost two plots of FIG. 9 show the Driver-to-Microphone responses for the two different outer mesh densities, demonstrating that the Speaker-to-Microphone couple can be adjusted to differing values, as described by Equation [1]. The uppermost of these two plots shows a higher level signal at the microphone because the outer mesh is denser (medium resistance Type 420), whereas the lower of the two plots indicates a smaller acoustic couple because the outer mesh is the less dense, Type 280, and so the $\{y/(y+x)\}$ factor of equation 1 is smaller.

The invention can be incorporated very easily into existing ANC earphone structures, and this can be done without incurring additional cost and without requiring any additional space or special features. In order to demonstrate this, an acoustic coupling arrangement using a Type 3 acoustic potentiometer (using an acoustic resistor/inertance combination) was integrated into an existing ANC earphone design (Incus Labs, model IL812) using the structure of FIG. 5. Full details of the design and internal structure of the earphone are disclosed in U.S. Pat. No. 8,989,424 B2, and are incorporated herein by reference.

Figure 10:
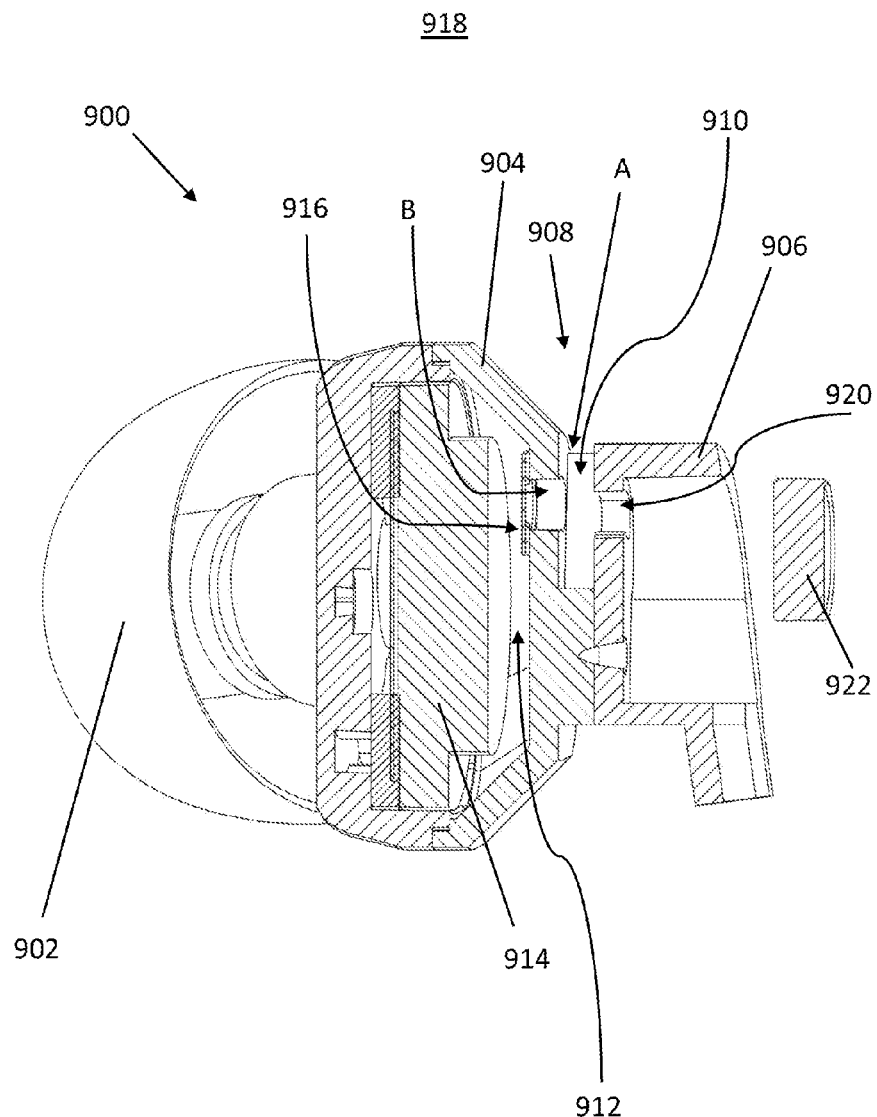
FIG. 10 shows an earphone, in partial section, incorporating an acoustic coupling arrangement according to the invention.
Figure 11:
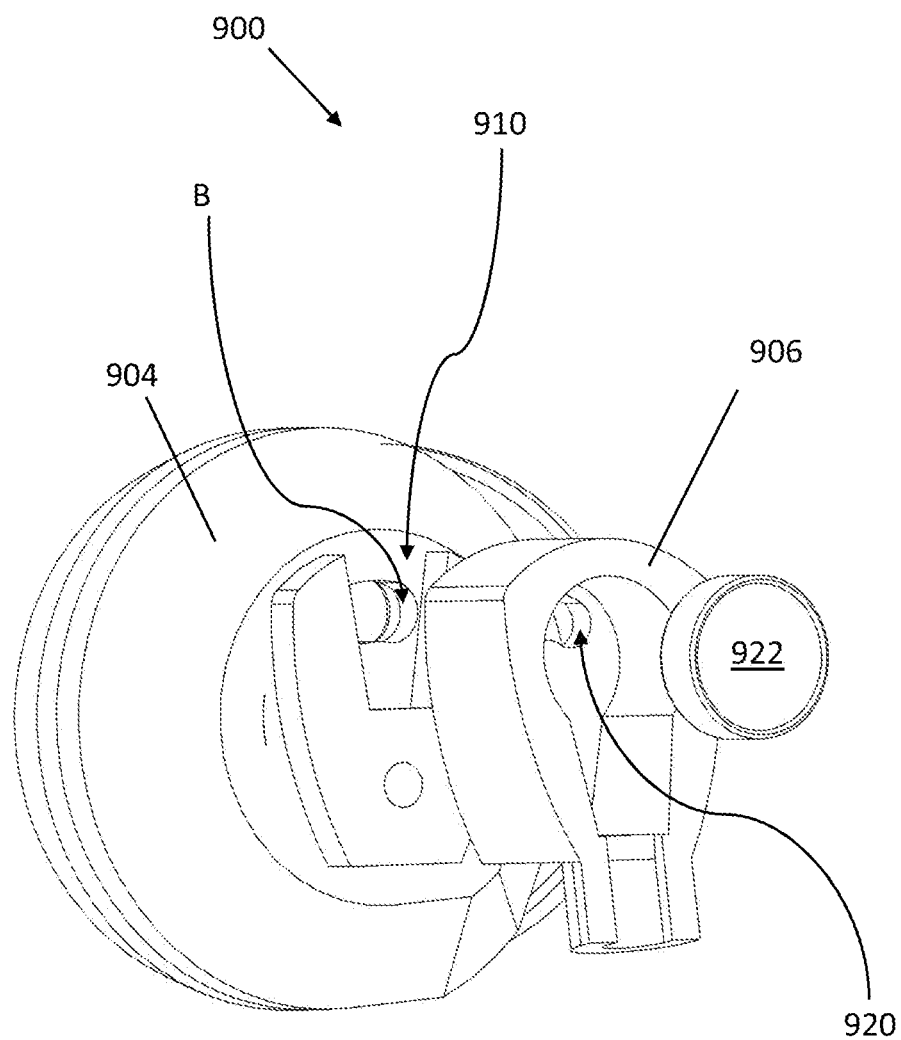
FIG. 11 is an exploded view of the earphone of FIG. 10.
Figure 12:
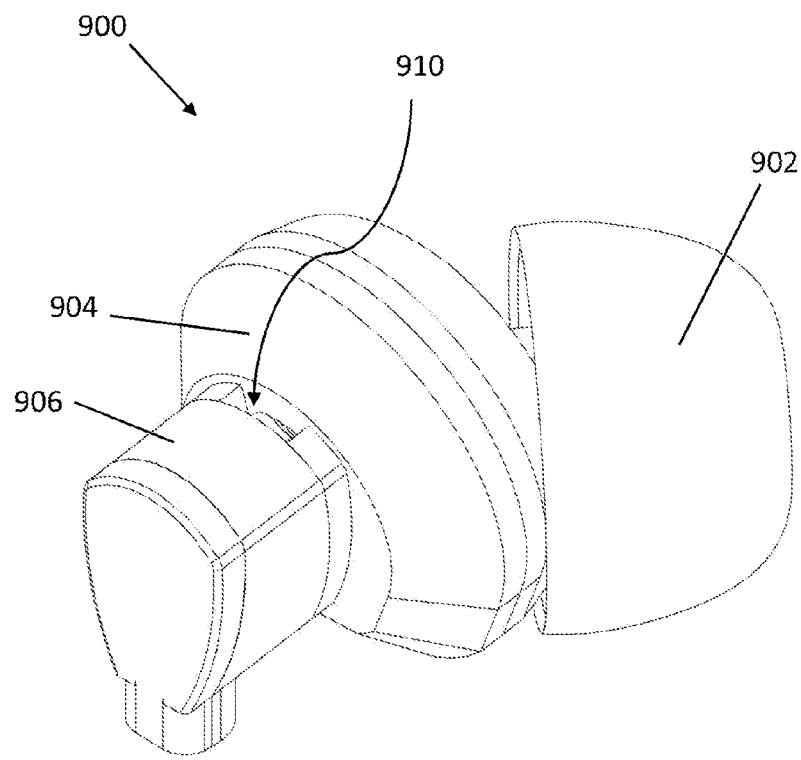
FIG. 12 shows the earphone of FIG. 10 in assembled form.

An earphone incorporating an acoustic coupling arrangement according to the invention is shown in detail in FIGS. 10-12.

FIG. 10 shows a sectional, end-elevation view of the earphone 900; on the left-hand side of the Figure lies the rubber "ear-bud" flange 902, with the main body 904 of the earphone and its microphone housing 906 on the right, in sectional view. The important feature here is the acoustic coupling arrangement 908 comprising a conduit 910 formed between the rear of the earphone main body 904 and the microphone housing 906. The arrangement 908 includes a port B formed in a side wall of the conduit 910, the port B connecting the rear volume 912 of the loudspeaker 914 to the conduit 910. The port B incorporates an acoustic resistor in the form of an acoustic resistor mesh 916 on an internal surface of the earphone body 904. The port B couples air in the rear-volume 912 to the ambient 918 via firstly, the acoustic resistor 916, and then secondly, the conduit 910. An inlet 920 for a feedforward ANC microphone 922 is located on the opposite side of the conduit 910 to the port B, in the manner described by FIG. 5, and hence the microphone 922 detects sound pressure at the conceptual node between the rear-vent acoustic mesh resistor and the conduit inertance, as depicted in FIG. 5B. In FIG. 10, the microphone 922 is shown moved outwards along its central axis for clarity.

FIG. 11 shows an exploded, isometric view of the earphone 900 to illustrate further the embodiment and particularly the shape and disposition of the conduit 910 molded into the earphone body. The conduit 910 used here is in the form of a tapered, vertically-oriented conduit or channel, having a lower width of 1.8 mm, an upper width of 3.0 mm and a depth of 1.0 mm. The conduit 910 is formed over the port B. The lower end of the conduit 910 is closed, and its uppermost end opens to the ambient air at the top of the structure, defining port A. When the microphone housing 906 is located in place, the microphone inlet 920 is exposed to the inside of the conduit 910, which becomes a tube-like channel which is closed at its lowermost end and open at the top.

FIG. 12 shows a further isometric view of the assembled earphone 900 with the microphone housing 906 now fixed in place onto the rear of the earphone body 904. The port A of the conduit 910 appears as a narrow slot adjacent to the curved edge of the rear body of the earphone 904. This is a good location for the conduit 910 because it is not exposed to the user's fingers (where it might create microphony noises when handled), nor is it directly exposed to wind pressure, which would create wind-noise artifacts.

Referring once again to the conceptual diagram of the acoustic potentiometer of FIG. 4, there is provided a microphone in a conduit in which there is an upper port "A" and a lower port "B", each port being provided with a resistive mesh overlay, said ports forming acoustic couples between the air in the enclosure and the air outside each respective port. The resistive mesh confers the property of acoustic resistance to the acoustic couples, which would otherwise be predominantly reactive in nature, in the form of acoustic inertances.

In the absence of the resistive mesh, however, the acoustic potentiometer principle still applies, with the potentiometric ratio now being defined by the impedances of the two inertances, rather than the two resistances. It will be appreciated that, in practice, the acoustic impedances discussed herein will never be either wholly resistive nor wholly reactive in nature, but will always exhibit a complex impedance property analogous to an electrical impedance, having both real and imaginary components.

Embodiments of the invention can be implemented advantageously in the form of a miniature module using microphones based on MEMS (Micro-Electro Mechanical Systems) technology, where the physical dimensions of the silicon microphone chip itself might be as small as 1 mm×2 mm, and have a thickness of only 1 mm.

In order to protect the microphone and supply it in a form that can be re-flow soldered for assembly into, for example, cellular phone handsets, each MEMS microphone chip is packaged by bonding it on to a miniature PCB-type substrate, forming appropriate acoustic seals around the microphone, and then sealing and bonding an upper, metallic casing on to the PCB substrate. The upper casing contains one or more micro-apertures which act as inlet ports to the microphone, connecting the external ambient air to the air within the package, and so to the microphone itself. The encapsulated package is very small. For example, the dimensions of the Knowles Electronics digital MEMS microphone type SPK0415HM4H are 3.00 mm×4.00 mm×1.06 mm.

The "rear-volume" air behind the microphone diaphragm is often coupled to the "front-volume" air within the package via a very small acoustic leakage that is created during the silicon fabrication process, comprising a number of microscopic holes (typically 20 μm in diameter) in parallel with the microphone diaphragm. This is to prevent stress and rupture of the diaphragm during temperature changes by providing an airflow leakage path for expanding (and contracting) air. The microphone responds solely to the front volume air pressure levels. Some MEMS microphones are mounted in a reversed format ("bottom port configuration") to save space or increase sensitivity (or both), such that the rear face of the diaphragm is exposed to the air (and the microphone's front-volume of air is connected to it via a very high impedance leakage, for the same safety reasons as described above). However, in both of these configurations—"top-port" and "bottom-port"—MEMS microphones respond to the single, ambient air pressure signal alone.

A further type of microphone configuration is known, often referred to as a "unidirectional" type, in which the front-volume of air, in front of the diaphragm, is coupled to the external ambient via a first port, and the rear-volume of air, behind the diaphragm, is coupled to the external ambient via a second port. As a consequence:

(a) the net force on the diaphragm is dependent on the difference between the pressures at each port, and so the resultant microphone signal represents the pressure difference between the two ports (it is a differential microphone); and (b) there is no airflow pathway through the microphone—airflow is blocked by the diaphragm.

Microphones of this type are often mounted in a casing or baffle for use near the lips of a user such that the close-proximity voice signal is closer to one microphone port than the other (and hence the signal is larger at that port than the other one), whereas background noise is present equally at both ports. As a consequence, the resultant difference signal from the microphone contains predominantly the voice signal, because the background noise signal is present at equal levels on both sides of the microphone diaphragm, such that there is no net pressure difference, and hence there is little or no background noise signal.

In contrast to this, the invention provides a microphone that responds to a pre-determined linear interpolative value between two independent pressure signals supplied via different ports.

The properties of these microphone types, MEMS-based and otherwise, together with those of the present invention, are summarized as follows, and apply to both analogue and digital types.

1. MEMS microphones having either (a) a top-port configuration, or (b) a bottom-port configuration, both have a single inlet port and generate an electrical signal that is proportional to the sound pressure level (SPL) at said inlet port (Equation [5]). There is no air pathway through the microphone.

$$V_{OUT} \propto SPL_{inlet1} \qquad [5]$$

2. Differential microphones, often termed "unidirectional" microphones, have two inlet ports (generally on the uppermost and lowermost faces of their casing or packaging), and generate an electrical signal that is proportional to the difference in SPL between the two inlet ports (Equation [6]). There is no air pathway through the microphone between the ports.

$$V_{OUT} \propto SPL_{inlet1} - SPL_{inlet2} \qquad [6]$$

3. The present invention has two ports, and generates an electrical signal that is proportional to a pre-determined linear interpolative value between the SPL at each of the two ports, according to Equations [7] (based on Equation [1]). An air pathway exists through the device, between the two ports.

$$V_{OUT} \propto \left\{\frac{y}{y+x}\right\}(SPL_{inlet1} - SPL_{inlet2}) + SPL_{inlet1} \qquad [7]$$

The MEMS technology and packaging arrangements are ideal for implementing a module-type embodiment of the invention, in which the microphone and its accompanying acoustic couples are provided as a single package to earphone and headphone manufacturers, such that there is no need for them to design and engineer the acoustic couples of the inventions themselves—the invention is supplied as a single, well-defined, self-calibrating ANC microphone package.

FIGS. 5, and 10-12 show examples of the acoustic coupling arrangement in which the uppermost port, exposed to the ambient, is an acoustic inertance rather than an acoustic resistance, and it will be appreciated that indeed both of the acoustic couples of the acoustic potentiometer could, in principle, be predominantly inertance-type impedances. This eliminates the need for using resistive mesh, which makes the device both simpler and less costly to manufacture. Additionally, it enables a much smaller implementation of the invention to be manufactured in the form of a MEMS-based module, embodiments of which are shown in FIGS. 13-15.

Figure 13A:
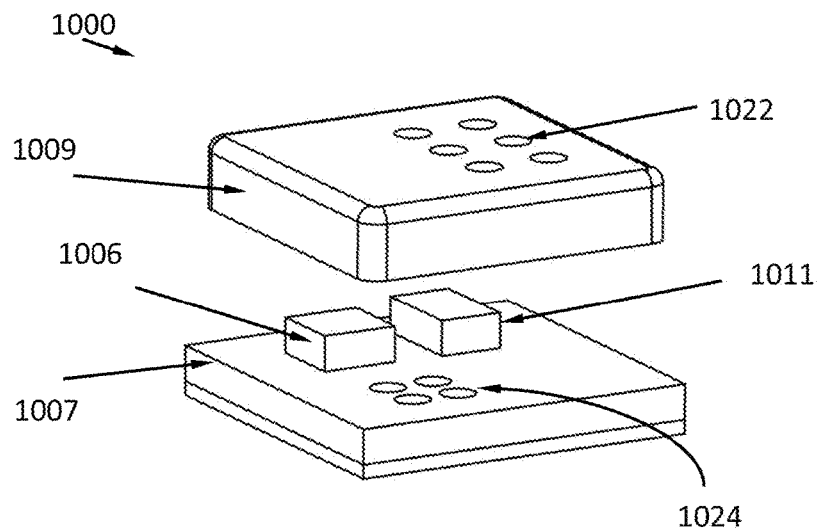
FIG. 13A shows an isometric, exploded view of a first MEMS microphone module incorporating an acoustic coupling arrangement according to the invention.
Figure 13B:
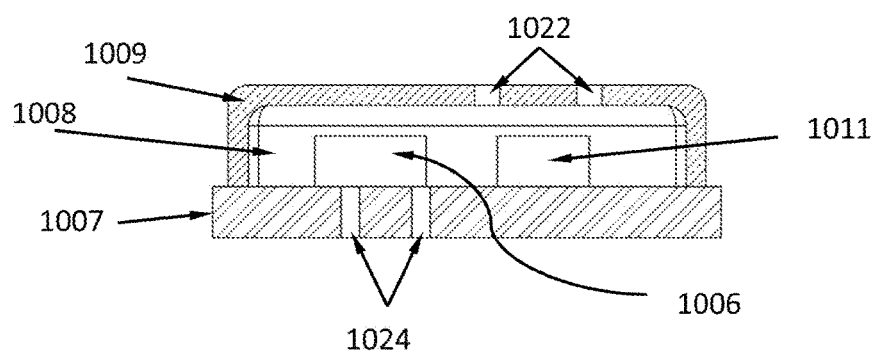
FIG. 13B shows a front-elevation sectional view through the module of FIG. 13A.

Referring now to FIGS. 13A & 13B, a MEMS-module 1000 is shown, comprising a MEMS microphone 1006 is mounted on to a substrate 1007, such as a miniature printed-wiring-board (PWB). The MEMS microphone 1006—depending on its specification—is typically accompanied by an ancillary integrated-circuit 1011 for carrying out some initial signal processing (such as A-D conversion, pre-amplification, multiplexing or other signal-processing). An upper casing 1009, usually formed from metal to provide electrical screening, is bonded to the substrate 1007 and sealed around its edges so as to form a conduit 1008 there between and enclose the MEMS microphone 1006 and associated circuitry within the conduit 1008. In this embodiment, there is provided one or more holes 1024 in the substrate 1007, preferably a small array of small-diameter holes (a first micro-aperture array), so as to form an acoustic couple between the air within the conduit 1008 and the air below the substrate 1007, typically a rear volume of a loudspeaker in use. The upper casing 1009 also contains one or more holes 1022, preferably a small array of small-diameter holes (a second micro-aperture array), so as to form an acoustic couple between the air within the conduit 1008 and the air above the upper casing 1009, typically ambient air in use.

The arrangement of FIGS. 13A & 13B provides a MEMS-based acoustic potentiometer, wherein the potentiometric fraction is defined by the ratio of the acoustic impedances of the first and second micro-aperture arrays formed by holes 1022, 1024.

In general, it is preferred to incorporate some degree of acoustic resistance into the micro-aperture arrays in order to reduce Helmholtz resonance effects. In terms of acoustic impedances, small holes and short-length apertures behave primarily as acoustic inertances. However, as the diameter of the hole or tube decreases, the frictional interactions between the air and the sidewalls of the tube begin to become significant and this increases the resistive component of their complex impedance. For short path-lengths through a sidewall or casing (say, less than 2 mm) then the acoustic resistance becomes significant when the diameter is less than 0.2 mm or thereabouts. For example, at 1 kHz, a 0.2 mm hole in a 0.2 mm thick substrate has a resistive component of 665.2 acoustic ohms (CGS units), and a reactive component of 873.2 acoustic ohms (CGS). Accordingly, by the use of small diameter apertures alone, a stable and precise device can be manufactured without the need for resistive mesh overlays.

The potentiometric ratio of the embodiment described above is defined by the impedances of the two acoustic couples, which in turn, are determined by the number and dimensions of the holes in each micro-aperture array. For example, if the holes are all, say, 0.2 mm in diameter and 0.2 mm in length, then an array of 5 holes in the substrate and 45 holes in the upper casing would provide a potentiometric fraction of 0.9 (as described by Equation [1]).

Figure 14A:
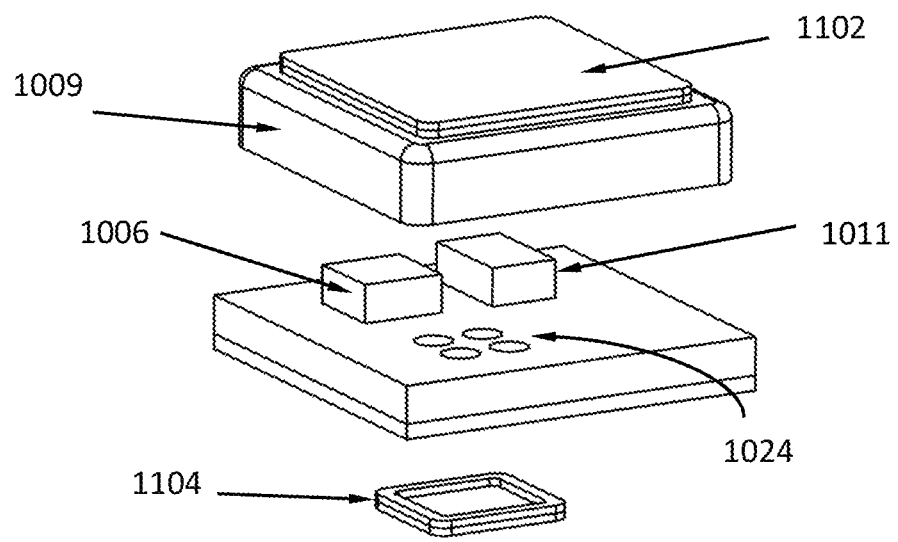
FIG. 14A shows an isometric, exploded view of a second MEMS microphone module incorporating an acoustic coupling arrangement according to the invention.
Figure 14B:
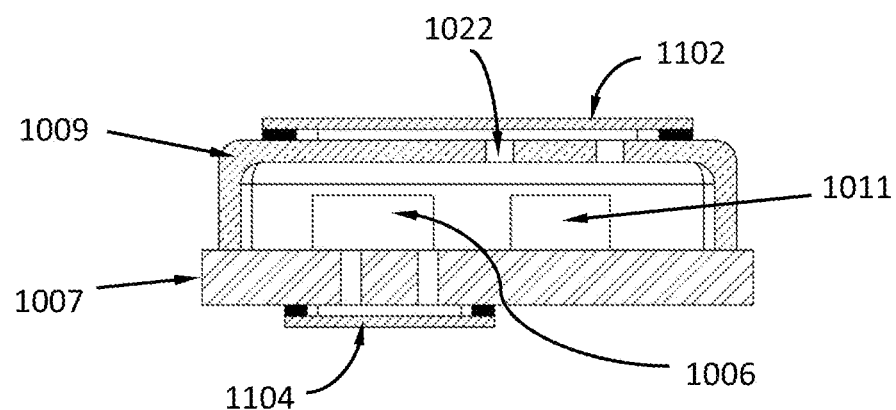
FIG. 14B shows a front-elevation sectional view through the module of FIG. 14A.
Figure 15:
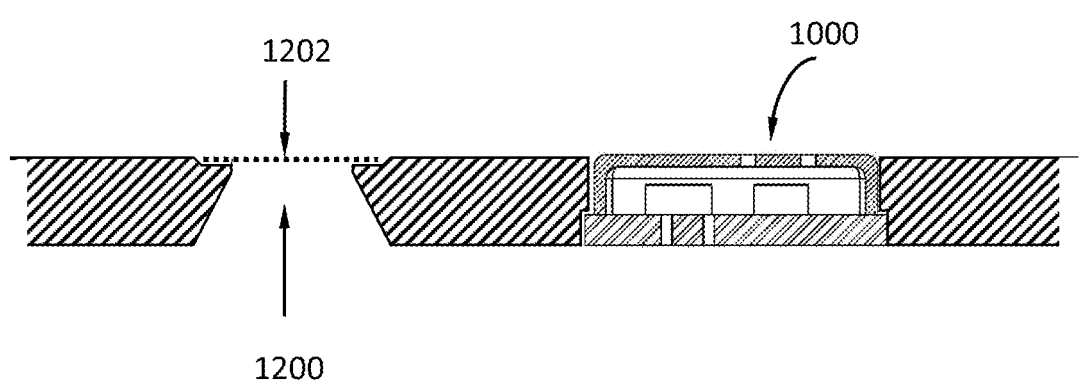
FIG. 15 shows a diagram of the module of FIGS. 13A & 13B implemented in conjunction with a parallel acoustic shunt.

A further embodiment ("B") of the invention is shown in FIGS. 14A & 14B, which is of the same general form as the embodiment of FIGS. 13A & 13B with an uppermost resistive mesh layer 1102 is provided on the casing 1009, and a lowermost resistive mesh layer 1104 provided on the substrate 1007. The resistive mesh layers 1102, 1104 contribute to the impedances of the two acoustic couples in the event that this is preferred by a manufacturer, perhaps for maximum damping or other reason.

In FIGS. 13 and 14, some detail of the assembly has been omitted for clarity. For example, solder bumps and interconnects are not shown.

In the earlier description of the invention in respect of FIG. 3A, it was noted that such an embodiment of the invention might replace directly the rear vent of a headphone, because its impedance could be calculated and engineered accordingly. However, in the miniature, module-type embodiments of the invention of FIGS. 13 and 14, the port or aperture dimensions are quite small and so the associated acoustic impedances are relatively large. In the event that the "through" impedance (that is, the serial addition of both uppermost and lowermost port impedances) of the module is larger than required for a desired rear volume compliance, it can be operated in parallel with a conventional resistive port, as shown in FIG. 15, to provide a suitable combined rear-vent impedance.

Using the earlier example, if an earphone or headphone were to require a rear-vent resistance of 50 acoustic ohms, and a MEMS-module 1000 of the invention had an acoustic resistance of 500 acoustic ohms, then, as shown in FIG. 15, it could be used in parallel with a rear-vent 1200 having a resistance of 55.5 acoustic ohms, such that the parallel combination of the two would effectively provide the requisite rear-vent acoustic resistance of 50 ohms. In practice, however, the impedances for this type of application are not generally critical, and the use of the module in conjunction with an existing headphone rear-vent port, without change, might prove to be acceptable.

The acoustic vent 1200 arranged in parallel with the MEMS-module 1000 in the implementation shown in FIG. 15 is shown as a resistive couple—a port featuring an acoustic resistance overlay 1202—but use of the invention is not restricted to this. The invention is suitable for use with all other types of acoustic vents, including those which are predominantly inertance in behavior, and also those featuring parallel combinations of an inertance couple (such as a short tube) and a resistance couple, as are known by those skilled in the art.

Accordingly, if an ANC headphone manufacturer were to have an existing design, it would be possible to incorporate the invention by simply substituting a MEMS-module based embodiment of the invention for the existing feedforward ANC microphone in the headphone, suitably coupled to the headphone rear-volume, thereby to provide a self-calibration facility.

Headphones bearing the invention can be calibrated as follows.

First, a representative ("Golden") sample ANC headphone, having speaker and microphone sensitivities equal to, or close to, the manufacturer's specifications (or the average value of a large batch) is calibrated in the prior-art manner by optimizing its ANC signal level so as to minimize the ambient noise perceived by a listener. The ANC gain level of the ANC system is recorded—let us say it is 15 dB at 1 kHz. (This can be done at several spot frequencies.)

Secondly, the "Golden" sample is used to establish the Sensitivity Index (SI) by driving an accurately known voltage source at a fixed frequency (e.g. 100 $mV_{RMS}$ at 1 kHz) into the headphone speaker, and the resultant self-calibration (i.e. feedforward) microphone signal (after fixed gain preamplification) is measured. This is done with the headphones hanging in free space, so as to avoid reflections and other interferences. The magnitude of the microphone signal represents the Sensitivity Index. Let us say, for example, that the pre-amplified microphone signal from such a procedure is 150 $mV_{RMS}$.

Thirdly, a candidate headphone is chosen for calibration, and subjected to procedure 2, above. The SI (microphone signal) is measured to be 180 $mV_{RMS}$. This indicates that the speaker or mic (or both of these) is more sensitive than the "Golden" sample, and so a lower ANC gain is required for optimal ANC performance. The 180-to-150 $mV_{RMS}$ ratio represents a SI increase of 1.58 dB for the candidate sample compared to the "Golden" sample, and so the ANC gain setting for the candidate headphones should be reduced to a value 1.58 dB below the Golden sample level of 15 dB, namely 13.42 dB.

One important factor in implementing the invention as a practical system is the accuracy of the associated electronics and signal-processing. For example, in an analogue system, there might be a 5% (or greater) variation in the system gain owing to the tolerances of the various gain-determining resistors, including PGAs (Programmable-Gain Amplifiers). Similarly, although a digital processing system is intrinsically precise, it still requires some analogue components for A-D conversion. These practical limitations can be overcome, however, by a small change in the above calibration procedure, as follows.

Instead of setting the ANC system gain to a pre-determined, known value (third step above), which might incur the associated tolerance errors described above, the ANC system gain is adjusted whilst monitoring the self-calibration microphone signal, and the latter is adjusted to be the identical to that of the "Golden" sample (150 $mV_{RMS}$). This can be done as an additional procedure following step 3, above, as follows.

Finally, the system gain—with its intrinsic tolerance variations—is adjusted whilst monitoring the SI (microphone signal). To begin with, as described in Step 3, above, this is measured to be 180 mV$_{RMS}$. The system gain is adjusted (reduced in this case) such that the microphone signal accurately matches that of the Golden sample, namely 150 mV$_{RMS}$.

This requires electrical access to various circuit nodes, and the ability to isolate certain elements of the ANC processing, but this can be achieved as part of an integrated ANC processor coupled with an associated microcontroller.

Another important factor in the self-calibration process is the reproducibility of the Speaker-to-Mic couple, because this defines directly the ANC gain level. If an acoustic coupling arrangement is used, the acoustic resistances used should have reproducible properties. Where different materials are used for the acoustic resistors, this may require precise control of the acoustic resistors. Where the same material is used in the acoustic resistors, reproducibility can be achieved by forming a pair of adjacent acoustic resistors in a single piece of mesh material, having suitable defining areas. Any variation in the mesh resistance would be common to both resistors, so the potentiometric ratio—defined by their areas—would be unaffected.

As described above, the invention is applicable to both headphones and earphones, and could also be used for the earpiece ANC system of a cellular-phone handset. For clarity, the term headphone used in the claims is used to include headphones, earphones and earpieces.

It will be appreciated that although the present invention relates to a feed-forward type ANC system, it is also equally applicable to the so-called "hybrid"-type ANC system, in which both a feed-forward ANC system and a feedback ANC system are operated simultaneously and in conjunction with one another.

The invention claimed is:

1. An active noise-reduction headphone arrangement, comprising:
    a housing bearing a loudspeaker for generating an audio signal, the loudspeaker comprising:
        a first diaphragm surface coupled to a first volume of air bounded by and coupled to a user's ear; and
        a second diaphragm surface bounding a cavity within the housing so as to define a second volume of air, rearward of the first diaphragm;
    an acoustic potentiometer comprising:
        a conduit provided in the housing;
        a first port and a second port in the conduit, wherein the first port acoustically connects the conduit to ambient air and the second port acoustically connects the conduit to the second volume of air, such that the audio signal generated by the loudspeaker is acoustically coupled to said conduit, the second port being spaced apart from the first port; and
        a microphone having an inlet coupled acoustically to a predetermined location within the conduit, the predetermined location of the inlet being spaced apart from the first port by a first length and from the second port by a second length, the predetermined location of said microphone within said conduit being selected to accurately control the magnitude of said audio signal to said microphone in accordance with a ratio of the first length and the second length.

2. The arrangement of claim 1, wherein at least one of the first port and the second port has acoustic impedance properties primarily characteristic of an acoustic resistance.

3. The arrangement of claim 2, wherein at least one of the first port and the second port is formed by sealing an overlying layer of resistive mesh material onto an opening having a predetermined surface area.

4. The arrangement of claim 2, wherein at least one of the first port and the second port is formed by incorporating a material having a bulk acoustic resistance property into the conduit.

5. The arrangement of claim 1, wherein at least one of the first port and the second port has acoustic impedance properties primarily characteristic of an acoustic inertance.

6. The arrangement of claim 1, wherein at least one of the first port and the second port is formed by a tube, recess, or conduit or by radiation impedance coupled to said microphone.

7. The arrangement of claim 1, wherein at least one of the first port and the second port comprises a plurality of openings arranged substantially symmetrically around a primary axis of the microphone.

8. The arrangement of claim 1, wherein the arrangement operates simultaneously and in conjunction with a feedback-type ambient noise-reduction system.

9. The arrangement of claim 1, wherein the arrangement operates simultaneously and in conjunction with both a feed-forward ANC system and a feedback ANC system.

10. An ambient noise-reduction system comprising:
    an audio device selected from the group consisting of a headphone, an earphone and a cellular-phone handset; and
    an active noise-reduction headphone arrangement incorporated with the audio device, wherein the active noise-reduction headphone arrangement comprises:
        a housing bearing a loudspeaker comprising:
            a first diaphragm surface coupled to a first volume of air bounded by and coupled to a user's ear; and
            a second diaphragm surface bounding a cavity within the housing so as to define a second volume of air, rearward of the first diaphragm;
        an acoustic potentiometer comprising:
            a conduit provided in the housing:
            a first port and a second port in the conduit, wherein the first port acoustically connects the conduit to ambient air and the second port acoustically connects the conduit to the second volume of air, such that the audio signal generated by the loudspeaker is acoustically coupled to said conduit, the second port being spaced apart from the first port; and
            a microphone having an inlet coupled acoustically to a predetermined location within the conduit, the predetermined location of the inlet being spaced apart from the first port by a first length and from the second port by a second length, the predetermined location of said microphone within said conduit being selected to accurately control the magnitude of said audio signal to said microphone in accordance with a ratio of the first length and the second length.

* * * * *